(12) United States Patent
Siguier et al.

(10) Patent No.: US 11,414,901 B2
(45) Date of Patent: Aug. 16, 2022

(54) SYSTEM FOR DETECTING APPROACH AND/OR CONTACT OF A USER AND ULTRA HIGH FREQUENCY COMMUNICATION WITH A PORTABLE USER APPARATUS

(71) Applicants: CONTINENTAL AUTOMOTIVE FRANCE, Toulouse (FR); CONTINENTAL AUTOMOTIVE GmbH, Hannover (DE)

(72) Inventors: Grégory Siguier, Toulouse (FR); Olivier Gerardiere, Toulouse (FR); John Jefferson Lackey, Rochester, MI (US); Maxime Micheau, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 700 days.

(21) Appl. No.: 16/431,923

(22) Filed: Jun. 5, 2019

(65) Prior Publication Data
US 2019/0376325 A1 Dec. 12, 2019

(30) Foreign Application Priority Data
Jun. 12, 2018 (FR) ...................................... 1855102

(51) Int. Cl.
*H01Q 1/32* (2006.01)
*E05B 81/76* (2014.01)
(Continued)

(52) U.S. Cl.
CPC .............. *E05B 81/77* (2013.01); *E05B 81/78* (2013.01); *H01Q 1/3233* (2013.01);
(Continued)

(58) Field of Classification Search
CPC ........ E05B 81/77; H03K 17/962; H01Q 1/22; H01Q 1/241–243; H01Q 1/48; H01Q 9/0407
See application file for complete search history.

(56) References Cited

U.S. PATENT DOCUMENTS

| 8,519,898 B2 | 8/2013 | Sampo et al. |
| 8,929,814 B2 | 1/2015 | Cheikh |
| (Continued) | | |

FOREIGN PATENT DOCUMENTS

| CN | 102144332 A | 8/2011 |
| CN | 102264582 A | 11/2011 |
| (Continued) | | |

*Primary Examiner* — Hasan Islam
(74) *Attorney, Agent, or Firm* — Nixon & Vanderhye

(57) ABSTRACT

Disclosed is a system for detecting approach and/or contact of a user and Ultra High Frequency communication with a portable user apparatus, intended to be embedded on board an automotive vehicle, the system including: a device for detecting approach and/or contact, including a sensor for detecting approach and/or contact and an electronic control unit; a conducting metal surface, suitable for the conduction of electric charges; and a communication device, including an Ultra High Frequency antenna emitting an electromagnetic field at an Ultra High Frequency wavelength, and a management unit for managing the emission and reception of data of the antenna. The conducting metal surface takes the form of a continuous path including a plurality of meanders spread over a length at least equal to:

$$L=\lambda/6$$

Figure 1:
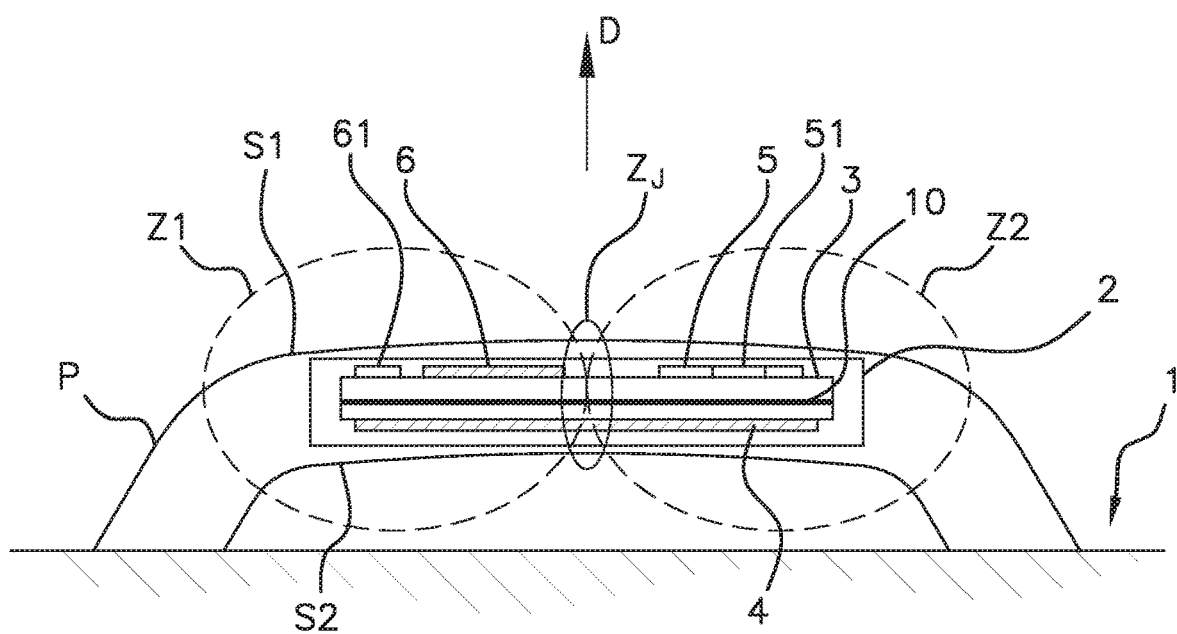

wherein L is a total length of the meanders, and $\lambda$ is a wavelength of the Ultra High Frequency antenna.

20 Claims, 3 Drawing Sheets

(51) Int. Cl.
*E05B 81/78* (2014.01)
*H01Q 1/48* (2006.01)
*H03K 17/96* (2006.01)

(52) U.S. Cl.
CPC ............ *H01Q 1/3283* (2013.01); *H01Q 1/48* (2013.01); *H03K 17/962* (2013.01); *E05Y 2900/531* (2013.01)

(56) References Cited

U.S. PATENT DOCUMENTS

| | | |
|---|---|---|
| 9,652,916 B2 | 5/2017 | Fontanet et al. |
| 2003/0128116 A1 | 7/2003 | Ieda et al. |
| 2011/0227710 A1 | 9/2011 | Nogami |
| 2011/0260831 A1 | 10/2011 | Ieda et al. |
| 2015/0054617 A1 | 2/2015 | Fontanet et al. |
| 2018/0069549 A1 | 3/2018 | Cooper et al. |
| 2020/0361415 A1* | 11/2020 | Godet ................ B60R 25/01 |

FOREIGN PATENT DOCUMENTS

| | | |
|---|---|---|
| CN | 102427170 A | 4/2012 |
| CN | 103346819 A | 10/2013 |
| EP | 1840845 | 10/2007 |
| FR | 3009879 | 2/2015 |
| FR | 3055347 | 3/2018 |
| JP | 2004-176343 | 6/2004 |

* cited by examiner

SYSTEM FOR DETECTING APPROACH AND/OR CONTACT OF A USER AND ULTRA HIGH FREQUENCY COMMUNICATION WITH A PORTABLE USER APPARATUS

The invention relates to a system for detecting approach and/or contact of the hand of a user and ultra-high frequency communication with a portable user apparatus. The invention applies more particularly to a vehicle openable panel, for example a door comprising a device for detecting approach and/or contact of a hand of a user toward/on the handle and a device for Ultra High Frequency communication with a portable apparatus, for example a smartphone (or "intelligent telephone") or "hands-free" fob for access to the vehicle.

Nowadays, vehicle door handles are equipped with capacitive sensors for detecting approach and/or contact of a user. The detection of approach and/or contact of a user, coupled with the recognition of a "hands-free" electronic fob or of a smartphone for remote access control carried thereby, allows the remote locking and unlocking of the openable panels of the vehicle. Thus, when the user, carrying the electronic fob or the corresponding smartphone identified by the vehicle, touches the door handle of his vehicle, the openable panels of the vehicle are automatically unlocked. By pressing on a precise location of the vehicle door handle, called the "unlocking zone", the door opens without needing to unlock it manually. Conversely, when the user, still carrying the necessary fob identified by the vehicle, wishes to lock his vehicle, he closes the door of his vehicle and he presses momentarily on another precise location of the handle, called the "locking zone". This movement makes it possible to lock the openable panels of the vehicle automatically.

These detection devices generally comprise two capacitive sensors, in the form of two electrodes linked electrically to a printed circuit and integrated into the door handle, each in a precise locking or unlocking zone. Generally, one electrode is dedicated to each zone, that is to say one electrode is dedicated to detecting the approach and/or contact of the user's hand in the locking zone and one electrode is dedicated to detecting the approach and/or contact of the user's hand in the unlocking zone.

The device for detecting locking/unlocking furthermore comprises a communication device in the form of a radio frequency antenna, in order to exchange an identifier between the vehicle and the hands-free access fob or the telephone.

This antenna can be of the Low Frequency (LF) type, for example at 125 kHz.

In the case where the portable device is a portable user apparatus such as a mobile telephone or a tablet, or a laptop computer, Radio Frequency and LF communication with the vehicle is not always possible, since most mobile telephones (or tablets, or laptop computer . . . ) do not possess any RF, or LF, means of communications whose frequencies are compatible with those used during communication with a vehicle, such as the frequencies of 315 MHz and 433.92 MHz for RF and 125 kHz for LF.

However, these portable user apparatuses now employ the Bluetooth® or Bluetooth Low Energy "BLE" communication standard, that is to say communication at Ultra High Frequency (UHF) from 2.4 GHz to 2.48 GHz. This communication standard exhibits the advantage of being universal and therefore does not require any accreditation specific to each country (only a Bluetooth Low Energy international certification), as is the case with the current RF and LF communications standards whose operating frequency differs according to country.

It therefore becomes necessary to adapt the "hands-free" access and/or starting system to a vehicle so that it can also operate with a portable user apparatus equipped with the Bluetooth® communication standard and no longer solely by way of radio waves and low-frequency waves (RF, LF).

The advantage of the Bluetooth® communication standard or of Bluetooth Low Energy BLE is that it allows a large communication range of about 100 m around the vehicle for BLE.

Bluetooth® communication therefore exhibits numerous advantages with respect to low frequency.

The device for detecting approach and/or contact is connected to the vehicle's electronic computer (ECU: English abbreviation for "Electronic Control Unit") and sends it a presence detection signal. The electronic computer of the vehicle has, beforehand, identified the user as being authorized to access this vehicle, or alternatively, subsequent to the reception of this presence detection signal, it undertakes this identification, carried out by the communication device operating at UHF.

As explained previously, when the "hands-free" access device is a portable user apparatus, the exchange of identifier takes place by Bluetooth® communication.

If the electronic computer recognizes the identification code as the one authorizing access to the vehicle, it triggers the locking/unlocking of the door (or of all the openable panels). If, on the other hand, the electronic computer has not received any identification code or if the identification code received is erroneous, locking or unlocking does not take place.

Such vehicles are therefore equipped with door handles comprising a system which itself comprises a device for detecting approach and/or contact in the form of two capacitive sensors, i.e., two electrodes linked to a microcontroller, integrated into a printed circuit and supplied with voltage and a UHF communication device in the form of an ultra-high frequency antenna A linked also to a control unit or an emission/reception management unit, integrated into the printed circuit.

Figure 2:
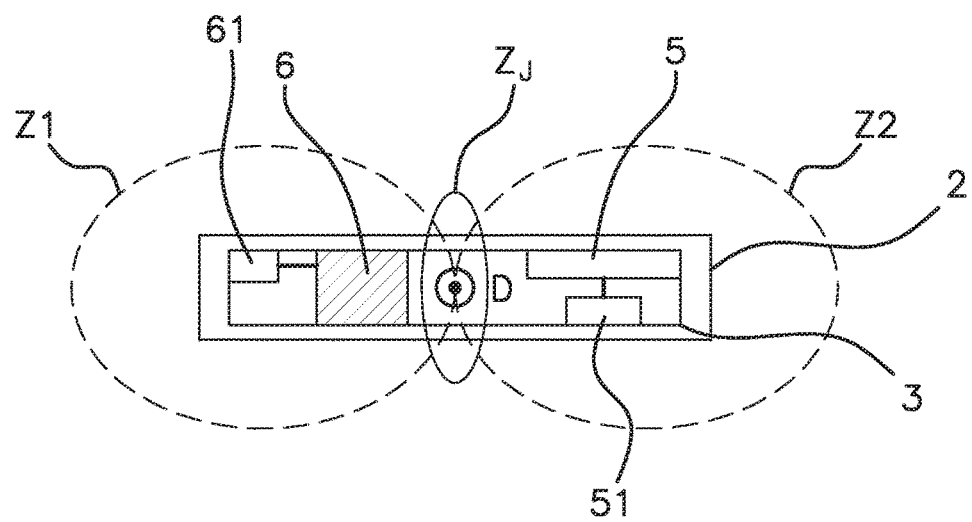

The system 2 of the prior art is described with regard to FIGS. 1 and 2.

The system 2 of the prior art is integrated into a handle P of automotive vehicle door 1.

The system 2 comprises at least one capacitive sensor for detecting approach and/or contact in the form of a locking electrode 6 linked to a control unit in the form of a microcontroller 61 integrated into a printed circuit 3.

The system 2 also comprises a UHF antenna 5, in the form of a BLE antenna 5, linked to a BLE emission/reception management unit 51, integrated into the printed circuit 3.

The UHF antenna 5 is for example situated, on the printed circuit 3 on the side of a first surface S1 of the handle which is oriented toward the exterior of the vehicle. Of course, other possibilities of positioning of the UHF antenna 5 are possible, said UHF antenna 5 may for example be situated on the side of the second surface S2, or consist of two parts linked together electrically, each situated on one side of one of the two exterior surfaces S1, S2.

Thus the UHF antenna 5 can communicate with a mobile telephone carried by a user situated some distance from the vehicle.

The locking electrode 6 is also situated on the printed circuit 3, on the side of the first surface S1 of the handle P which is oriented toward the exterior of the vehicle, that is to say on the front face of the handle P.

Thus the detection of approach and/or contact of the user's hand by the locking electrode 6 makes it possible to lock the vehicle.

According to the prior art, the system generally comprises an unlocking electrode 4 situated on the printed circuit 3, on the side of a second surface S2, which is oriented toward the vehicle, that is to say on the rear face of the handle P.

Thus, the detection of approach and/or contact of the hand near the unlocking electrode, that is to say between the second surface S2 of the handle P and the door 1, triggers the unlocking of the door 1.

The printed circuit 3 comprises in a manner known per se, a ground plane 10, between the two electrodes, thus avoiding interference between said two electrodes 6, 4.

The ground plane 10 serves as shielding between the two locking 6 and unlocking 4 electrodes. Said ground plane 10 also serves as reference in respect of potential for the UHF antenna 5.

However, the integration of the UHF antenna 5 into the handle exhibits a major drawback. In this instance the presence of conducting metal, in the locking electrode 6 and/or in the ground plane 4 of the printed circuit 3, and by extension in any conducting metallic surface, gives rise to a flow of electric micro-currents in said electrode 6 which creates a parasitic electromagnetic field disturbing the electromagnetic radiation of the UHF antenna 5.

This is illustrated by the radiation zones Z1 and Z2 in FIGS. 1 and 2.

The electromagnetic radiation around the UHF antenna 5 is not homogeneous and takes the form of two lobes Z1 and Z2 (whose dimensions with respect to the handle P have been reduced for purely explanatory purposes), meeting in a junction zone Zj for example, lying between the UHF antenna 5 and the locking electrode 6 or for example situated in the middle of the printed circuit 3 and exhibiting in this junction zone Zj a "null" of electromagnetic radiation of the UHF antenna 5. By "null" is meant a zone of weaker radiation, or of absence of radiation. This absence of radiation lies in a plane perpendicular to the plane of the UHF antenna 5 and therefore perpendicular to the first surface S1 of the handle P.

More precisely, the electromagnetic radiation in the direction D (illustrated by an arrow in FIGS. 1 and 2) perpendicular to the plane defined by the UHF antenna 5—or by the first surface S1 of the handle P—is weakened.

This is particularly annoying, since this direction D is the main direction of approach of the user toward the vehicle.

Thus, the range of the UHF communication with the portable user apparatus is not ensured in a homogeneous manner around the handle P, said communication range is much reduced, or indeed it is not ensured when the user is facing the UHF antenna 5. This gives rise to a delay in the identification of the user, or indeed even to the absence of identification, which is undesirable.

This phenomenon of disturbances of the electromagnetic field of the UHF antenna 5 occurs not only when an electrode is in proximity to said antenna, but also when any conducting metal surface, shielding electrode, ground plane is situated in proximity to the antenna.

The invention therefore proposes a system for detecting approach and/or contact of the hand of a user and ultra-high frequency communication with a portable user apparatus alleviating the drawbacks of the prior art.

The invention proposes a system for detecting approach and/or contact of a user and Ultra High Frequency communication with a portable user apparatus, intended to be embedded on board an automotive vehicle, said system comprising:
a device for detecting approach and/or contact, comprising a sensor for detecting approach and/or contact and an electronic control unit,
a conducting metal surface, suitable for the conduction of electric charges,
a communication device, comprising an Ultra High Frequency antenna emitting an electromagnetic field at an Ultra High Frequency wavelength, and a management unit for managing the emission and reception of data of said antenna,
said system being noteworthy in that the conducting metal surface takes the form of a continuous path comprising a plurality of meanders spread over a length at least equal to:

$$L=\lambda/6$$

with:
L total length of the meanders,
λ: wavelength of the Ultra High Frequency antenna.

Preferentially, part of the plurality of meanders takes the form of slots, or of sawteeth, or of sinusoid.

Advantageously, the UHF antenna being defined by a longitudinal axis and a transverse axis, said system is characterized in that at least part of the plurality of meanders is oriented along an axis parallel to the longitudinal axis or parallel along the transverse axis, or along an inclined axis with respect to one or the other of the axis parallel to the longitudinal axis or to the transverse axis.

In a first embodiment of the invention, the sensor for detecting approach and/or contact is a capacitive sensor and the conducting metal surface is an electrode of said sensor.

In a second embodiment of the invention, the conducting metal surface is an electrical ground plane.

The invention applies to any automotive vehicle door handle, comprising a system according to any one of the previously enumerated characteristics.

The invention relates to any automotive vehicle, comprising a system according to any one of the previously enumerated characteristics.

Figure 3:
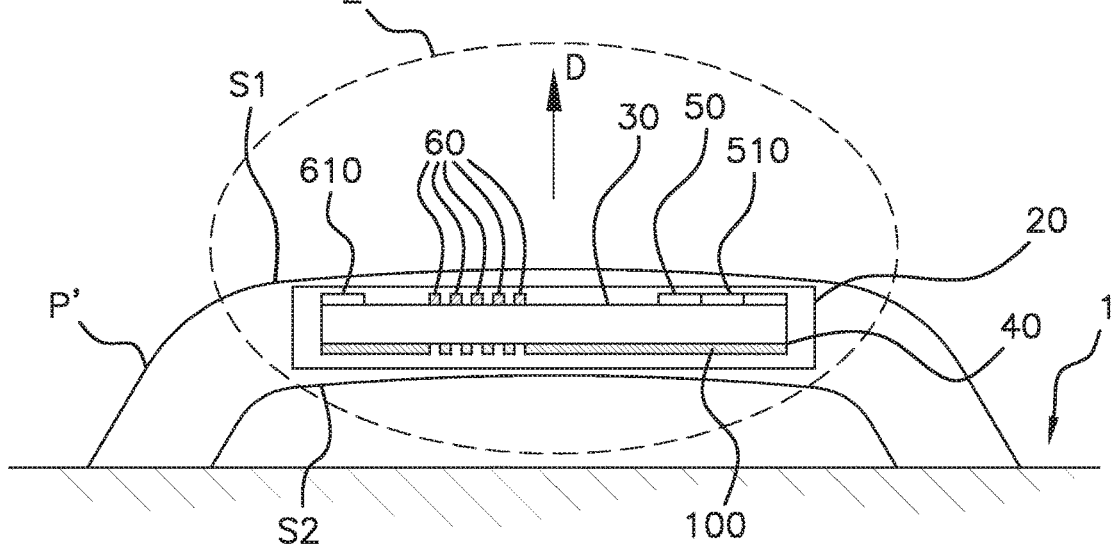
Figure 4A:
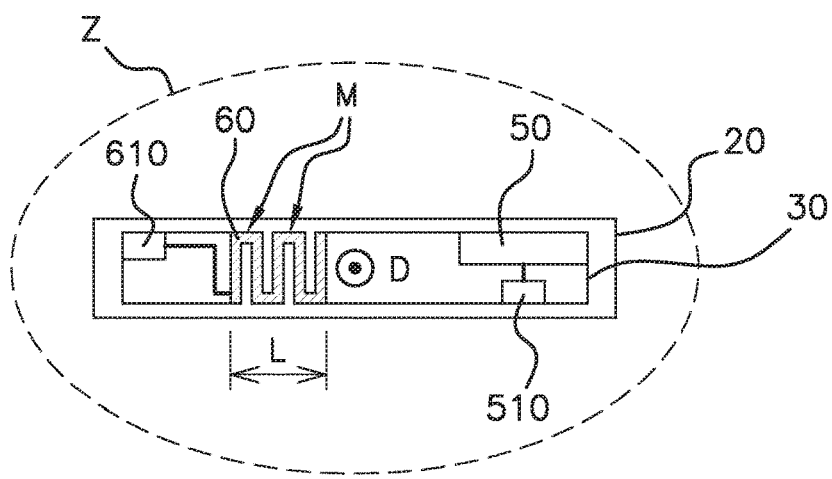
Figure 4B:
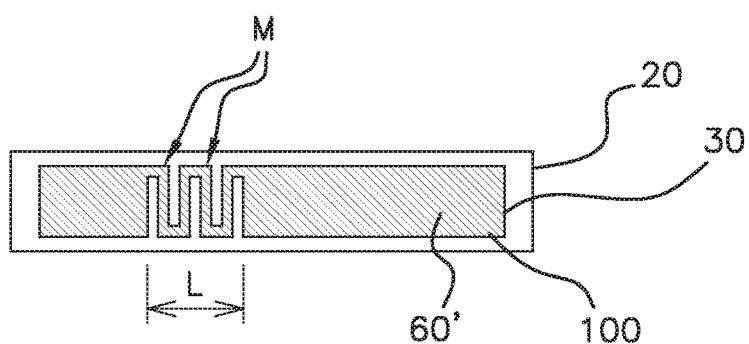

Other subjects, characteristics and advantages of the invention will become apparent on reading the description which follows by way of nonlimiting example and on examining the appended drawings, in which:

FIG. 1, already explained previously, schematically represents a sectional view of a system according to the prior art comprising a device for detecting approach and/or contact and a UHF communication device integrated into an automotive vehicle door handle, FIG. 2 already explained previously, schematically represents a view from above of the system 2 illustrated in FIG. 1, FIG. 3 schematically represents a sectional view of a system comprising a device for detecting approach and/or contact and a UHF communication device integrated into an automotive vehicle door handle, according to the invention, FIG. 4a schematically represents a view from above of the system illustrated in FIG. 3, FIG. 4b schematically represents a view from below of the system illustrated in FIG. 3, FIGS. 5a to 5c schematically represent embodiments of the detection system according to the invention.

As described previously, the detection system 2 of the prior art, for example integrated into a vehicle door 1 handle P, comprising a conducting metal surface, such as an electrode 6, situated in proximity to a UHF Ultra High Frequency antenna 5, such as an antenna of Wifi, Blue tooth or other type, does not make it possible to communicate at Ultra High Frequency with a portable user apparatus in a robust manner. The presence of this conducting metal surface disturbs the operation of the UHF antenna 5 and renders UHF communication inoperative in certain zones Zj around the handle P.

By UHF, Ultra High Frequency, is also meant Wifi or other communication of frequency greater than 3 GHz.

The invention proposes a system 20, illustrated in FIGS. 3, 4a, 4b, 5a to 5c making it possible to alleviate the drawbacks of the prior art.

According to the invention, the system 20 for detecting approach and/or contact of a user and ultra-high frequency communication with a portable user apparatus, comprises as in the prior art:
- a device for detecting approach and/or contact of a user, comprising a sensor for detecting approach and/or contact and an electronic control unit 610.
- a conducting metal surface 60,
- a UHF communication device, comprising an ultra-high frequency antenna 50 and a management unit 510 for managing the emission and reception of the data at UHF by way of said antenna.

In the case where the system 20 comprises a device for detecting approach and/or contact such as a capacitive sensor, the conducting metal surface 60 can consist of a locking or unlocking electrode 60 of said sensor.

In the case where the system 20 comprises a device for detecting approach and/or contact in the form of a Hall-effect sensor or an inductive sensor, the conducting metal surface 60 can consist of a ground plane 100 integrated into a printed circuit 30 (cf. hereinbelow).

By "conducting metal surface" is meant any surface allowing the conduction of electric charges.

The management unit 510 for managing the emission and the reception of the data at UHF comprises in a manner known per se, an emitter receiver and an adaptation element for adapting the frequency of said UHF antenna 50, in the form of an inductor or capacitor for example and linked to said UHF antenna 50.

The electronic control unit 610 takes the form of a microcontroller 610 controlling the sensor for detecting approach and/or contact, electrically powering the sensor and validating the detection of approach and/or of contact of the sensor.

The electronic control unit 610, the conducting metal surface 60, the antenna 50 and the management unit 510 are in a preferential, but nonlimiting, manner situated on a printed circuit 30.

The UHF antenna 50 can also be sited remotely from the printed circuit 30, and linked electrically to the management unit 510, the latter being situated on the printed circuit 30.

The invention proposes that the conducting metal surface 60 take the form of a continuous path exhibiting a plurality of meanders M such that the total length L of the meanders is greater than:

$$L \geq \frac{\lambda}{6}$$

With:
L: total length of the surface on which the meanders are situated (mm).
λ: wavelength of the ultra-high frequency (mm).

The applicant has indeed noted that, by modifying the shape of the conducting metal surface which was, according to the prior art, generally rectangular (cf. reference 6 in FIG. 2), into a continuous path exhibiting a plurality of meanders M (cf. FIGS. 4a, and FIGS. 5a to 5c) spread over a length L at least equal to a sixth of the wavelength of the UHF antenna 50, the electromagnetic field of said UHF antenna 50 was no longer impacted by the presence of said surface. The radiation zone Z of the electromagnetic field is then homogeneous around the handle P, this is illustrated in FIGS. 3 and 4a.

By "continuous path" is meant a path not exhibiting any interruption of material or any cut and allowing the current to flow from one end of the path to the other opposite end of the path.

By "meanders" M is meant any shape exhibiting a turning, a curve or an outbound- inbound portion, or a change of direction in the continuous path.

Thus, part of the plurality of meanders M can take the form of slots, regular (cf. FIG. 4a) or irregular (FIG. 5), of sawteeth (FIG. 5c), of a sinusoid (not represented), or of a combination of these stated shapes.

Figure 5A:
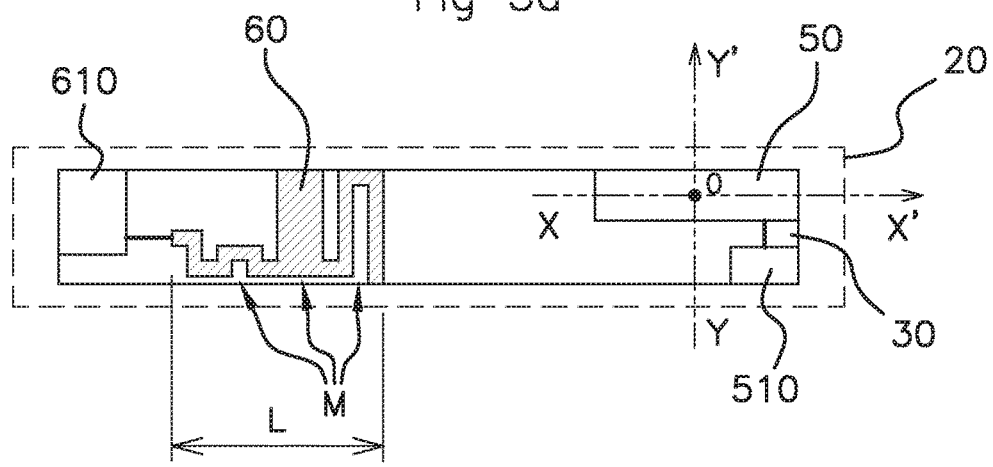
Figure 5B:
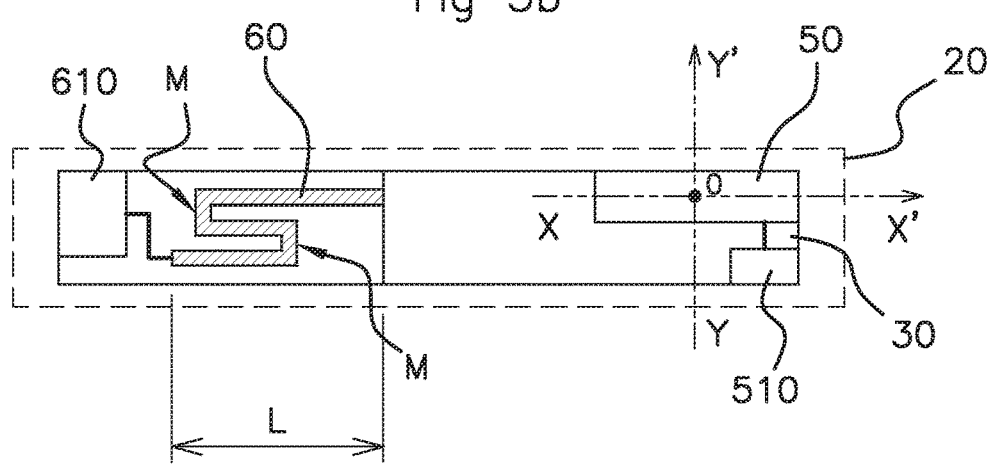

The meanders can all be identical (cf. FIGS. 4a, 5c), or exhibit mutual differences (cf. FIGS. 5a and 5b).

In FIGS. 3 and 4a are represented a sectional view and a view from above of the system 20 according to the invention.

In FIG. 4a, the conducting metal surface, in this example, consisting of the electrode 60 of a capacitive sensor, takes the form of a continuous path consisting of a succession of meanders M in the form of slots, of length L greater than $$\frac{\lambda}{6}.$$

The electrode 60 is linked to the control unit 610 and is situated on the printed circuit 30, on which are also situated the HF antenna 50 linked to the management unit 510.

The UHF antenna 50 is defined according to two axes, a longitudinal axis XX' and a transverse axis YY', which are mutually perpendicular and cut one another at a center 0 of said antenna.

In FIG. 4a, the meanders are oriented along an axis parallel to the transverse axis YY'.

The radiation zone Z around the system 20 is homogeneous and does not exhibit any null, or any zone of absence of radiation as in the prior art.

Figure 5C:
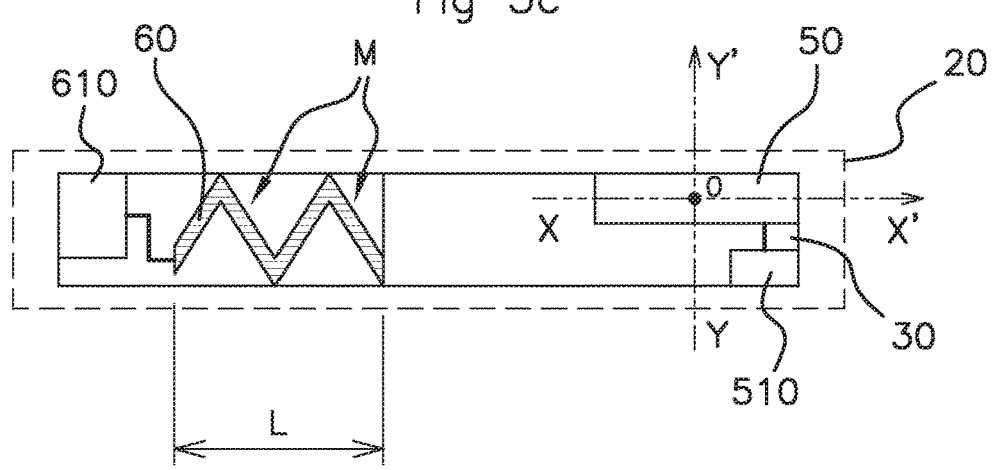

In FIGS. 5a to 5c, other shapes of meanders M are represented.

In FIG. 5a, the meanders M take the form of non-mutually symmetric slots, of mutually variable lengths and widths, oriented along an axis parallel to the transverse axis YY'.

In FIG. 5b, the meanders take the form of non-symmetric slots, oriented along an axis parallel to the longitudinal axis XX'.

In FIG. 5c, the meanders M take the form of mutually symmetric sawteeth, oriented along a transverse axis YY'. The sawteeth may also not exhibit any mutual symmetry.

Of course, other shapes of meanders M are conceivable, for example in the form of a sinusoid.

Other orientations of the meanders M are also possible, for example the meanders M may be oriented along an axis which is inclined at an angle with respect to an axis parallel either to the longitudinal axis XX', or to the transverse axis YY'.

In FIG. 4b, the conducting metal surface 60' consists of the electrical ground plane 100 of the printed circuit. The ground plane is modified according to the invention and present on a part of length L at least equal to $$\frac{\lambda}{6},$$

meanders M, in this example, in the form of slots.

The invention therefore makes it possible, in a judicious manner, through the shape of the conducting metal surface, to eliminate the disturbances in the electromagnetic radiation of the UHF antenna which are generated by the presence of said metallic surface in proximity.

The invention is all the more ingenious, as the operation of the metal surface in the guise of capacitive sensor electrode or ground plane electrode is not impacted by this shape of continuous path consisting of meanders.

The invention is robust, inexpensive and easy to implement and solves the problem of integrating a UHF antenna into a handle comprising metallic surfaces that disturb the operation of the UHF antenna.

The invention claimed is:

1. A system (20) for detecting approach and/or contact of a user and Ultra High Frequency communication with a portable user apparatus, intended to be embedded on board an automotive vehicle, said system comprising:
    a device for detecting the approach and/or contact, comprising a sensor for detecting the approach and/or contact and an electronic control unit (61),
    a conducting metal surface (60), suitable for the conduction of electric charges,
    a communication device, comprising an Ultra High Frequency antenna (50) emitting an electromagnetic field at an Ultra High Frequency wavelength ($\lambda$), and a management unit (51) for managing the emission and reception of data of said antenna, the presence of this conducting metal surface disturbing an operation of the Ultra High Frequency antenna (50) and rendering the Ultra High Frequency communication inoperative in certain zones (Zj) around the system (20),
    wherein the conducting metal surface (60) takes the form of a continuous path comprising a plurality of meanders (M) spread over a length (L) at least equal to:

$$L=\lambda/6$$

with:
L being a total length of the plurality of meanders, and
$\lambda$ being a wavelength of the Ultra High Frequency antenna.

2. The system (20) as claimed in claim 1, wherein at least part of the plurality of meanders (M) takes the form of slots, or of sawteeth, or of sinusoid.

3. The system (20) as claimed in claim 1, wherein the UHF antenna (50) being defined by a longitudinal axis (XX') and a transverse axis (YY'), wherein at least part of the plurality of meanders (M) is oriented along an axis parallel to the longitudinal axis (XX'), or parallel along the transverse axis (YY'), or along an inclined axis with respect to one or the other of the axis parallel to the longitudinal axis (XX') or to the transverse axis (YY').

4. The system (20) as claimed in claim 1, wherein the sensor for detecting approach and/or contact is a capacitive sensor and that the conducting metal surface (60) is an electrode of said sensor.

5. The system as claimed in claim 1, wherein the conducting metal surface (60') is an electrical ground plane (100).

6. A handle (P) of automotive vehicle door (1), comprising the system (20) as claimed in claim 1.

7. An automotive vehicle, comprising the system (20) as claimed in claim 1.

8. The system (20) as claimed in claim 2, wherein the UHF antenna (50) being defined by a longitudinal axis (XX') and a transverse axis (YY'), wherein at least part of the plurality of meanders (M) is oriented along an axis parallel to the longitudinal axis (XX'), or parallel along the transverse axis (YY'), or along an inclined axis with respect to one or the other of the axis parallel to the longitudinal axis (XX') or to the transverse axis (YY').

9. The system (20) as claimed in claim 2, wherein the sensor for detecting approach and/or contact is a capacitive sensor and that the conducting metal surface (60) is an electrode of said sensor.

10. The system (20) as claimed in claim 3, wherein the sensor for detecting approach and/or contact is a capacitive sensor and that the conducting metal surface (60) is an electrode of said sensor.

11. The system (20) as claimed in claim 8, wherein the sensor for detecting approach and/or contact is a capacitive sensor and that the conducting metal surface (60) is an electrode of said sensor.

12. The system as claimed in claim 2, wherein the conducting metal surface (60') is an electrical ground plane (100).

13. The system as claimed in claim 3, wherein the conducting metal surface (60') is an electrical ground plane (100).

14. The system as claimed in claim 8, wherein the conducting metal surface (60') is an electrical ground plane (100).

15. A handle (P) of automotive vehicle door (1), comprising the system (20) as claimed in claim 2.

16. A handle (P) of automotive vehicle door (1), comprising the system (20) as claimed in claim 3.

17. A handle (P) of automotive vehicle door (1), comprising the system (20) as claimed in claim 4.

18. A handle (P) of automotive vehicle door (1), comprising the system (20) as claimed in claim 5.

19. An automotive vehicle, comprising the system (20) as claimed in claim 2.

20. An automotive vehicle, comprising the system (20) as claimed in claim 3.

* * * * *